US006824655B2

(12) United States Patent
Makarov et al.

(10) Patent No.: US 6,824,655 B2
(45) Date of Patent: Nov. 30, 2004

(54) PROCESS FOR CHARGED PARTICLE BEAM MICRO-MACHINING OF COPPER

(75) Inventors: Vladimir V. Makarov, Palo Alto, CA (US); Javier Fernandez Ruiz, Cadiz (ES); Tzong-Tsong Miau, Sunnyvale, CA (US)

(73) Assignee: Credence Systems Corporation, Milpitas, CA (US)

( * ) Notice: Subject to any disclaimer, the term of this patent is extended or adjusted under 35 U.S.C. 154(b) by 0 days.

(21) Appl. No.: 10/227,745

(22) Filed: Aug. 26, 2002

(65) Prior Publication Data

US 2003/0038113 A1 Feb. 27, 2003

Related U.S. Application Data

(60) Provisional application No. 60/315,251, filed on Aug. 27, 2001.

(51) Int. Cl.$^7$ .............................. C23C 14/34; C23F 1/00
(52) U.S. Cl. ............................ 204/192.34; 204/192.35; 204/192.37; 216/66; 216/78; 216/79
(58) Field of Search ..................... 204/192.34, 192.35, 204/192.37; 216/66, 78, 79

(56) References Cited

U.S. PATENT DOCUMENTS

| | | | |
|---|---|---|---|
| 5,140,164 A | 8/1992 | Talbot et al. | 250/492.2 |
| 5,336,363 A | 8/1994 | Morita | 156/625 |
| 5,616,921 A | 4/1997 | Talbot et al. | 250/307 |
| 5,700,526 A | 12/1997 | Ximen et al. | 427/529 |
| 5,747,818 A | 5/1998 | Cecere | 250/492.2 |
| 5,766,379 A | 6/1998 | Lanford et al. | 148/537 |
| 5,798,529 A | 8/1998 | Wagner | 250/492.2 |
| 5,840,630 A | 11/1998 | Cecere et al. | 408/712 |
| 5,851,413 A | 12/1998 | Casella et al. | 216/92 |
| 5,899,740 A | 5/1999 | Kwon | 438/627 |
| 5,958,799 A | 9/1999 | Russell et al. | 438/712 |
| 5,959,358 A | 9/1999 | Lanford et al. | 257/762 |
| 6,031,229 A | 2/2000 | Keckley et al. | 250/309 |
| 6,057,223 A | 5/2000 | Lanford et al. | 438/618 |
| 6,140,655 A | 10/2000 | Russell et al. | 250/492.2 |
| 6,322,672 B1 | 11/2001 | Shuman et al. | 204/192.34 |
| 6,407,001 B1 | 6/2002 | Scott | 438/712 |
| 6,509,276 B2 | 1/2003 | Scott | 438/712 |
| 6,514,866 B2 | 2/2003 | Russell et al. | 438/712 |
| 2001/0053605 A1 | 12/2001 | Phaneuf et al. | 438/689 |
| 2002/0094694 A1 | 7/2002 | Russell et al. | 438/712 |
| 2002/0195422 A1 | 12/2002 | Sievers et al. | 216/62 |
| 2003/0038113 A1 | 2/2003 | Makarov et al. | 216/66 |
| 2003/0060048 A1 | 3/2003 | Russell et al. | 438/689 |

FOREIGN PATENT DOCUMENTS

| | | | |
|---|---|---|---|
| JP | 02-295117 | 6/1990 | H01L/21/322 |
| JP | 04-173988 | 6/1992 | C23F/4/00 |

OTHER PUBLICATIONS

Goldblatt et al., "Unique and Practical IC Timing Analysis Tool Utilizing Intrinsic Photon Emission," *Microelectronics Reliability Conference*, 2001, 41(9–10):1507–1512.

Knebel et al., "Diagnosis and Characterization of Timing–Related Defects by Time–Dependent Light Emission," *IEEE International Test Conference*, 1998, pp. 733–739.

Lundquist et al., "Ultra–Thinning of C4 Integrated Circuits for Backside Analysis during First Silicon Debug," *Microelectronics Reliability Conference*, 2001, 41(9–10):1545–1549.

Lundquist amd McManus, "Characterize Gate–Level Transistor Performance with PICA," *Semiconductor International*, 2001, 4 pgs.

Makarov et al., "Practical FIB Chemistry for Etching Copper,"Present at *AVS Third International Conference on Microelectronics and Interfaces (ICMI)*, Feb. 12, 2002, 3 pgs.

Musil et al., "Focused Ion Beam Microsurgery for Electronics," *IEEE Electron Device Letters*, 1986, EDL–7(5):285–287.

Edinger, "Gas assisted etching of copper with focused ion beams," *J. Vac. Sci. Technol. B*, 1999, 17(6):3058–3062.

Igarashi et al., "Dry Etching Technique or Subquarter–Micron Copper Interconnects," *J. Electrochem. Soc.*, 1995, 142(3):L36–L37.

R. Bender et al., "Focused Ion Beam Analysis of Organic Low–k Dielectrics," Proceeding from the 26th International Symposium for Testing and Failure Analysis, Nov. 12–16, 2000, pp. 397–405.

K. Edinger, et al., "Study of precursor gases for focused ion beam insulator deposition," J.Vac.Sci.Technol.B 19(6), Nov./Dec. 1998, pp. 3311–3314.

J. Gonzalez et al., "Chemically enhanced focused ion beam micromachining of copper," J.Vac.Sci.Technol.B 19(6), Nov./Dec. 2001, pp. 2539–2542.

J. Gonzalez et al., "Improvements in focused ion beam micromachining of interconnect materials," J.Vac.Sci.Technol.B 20(6), Nov./Dec. 2002, pp. 2700–2704.

S. Herschbein et al., "The Challenges of FIB Chip Repair & Debug Assistance in the 0.25um Copper Interconnect Millenium," Proceedings from the 24th International Symposium for Testing and Failure Analysis, Nov. 15–19, 1998, four pages.

P.Ho et al., Low Dielectric Constant Materials for IC Applications, Springer Verlag, 2003, Chapter 1, pp. 1–21.

(List continued on next page.)

*Primary Examiner*—Steven Versteeg
(74) *Attorney, Agent, or Firm*—Dorsey & Whitney LLP

(57) ABSTRACT

A micro-machining process that includes etching a substrate having copper overlying a dielectric layer to a charged particle beam in the presence of an etch assisting agent. The etch assisting agent is selected from the group consisting of ammonia, acetic acid, thiolacetic acid, and combinations thereof.

45 Claims, 6 Drawing Sheets

OTHER PUBLICATIONS

V. Makarov et al., "Dry Etching Considerations fro Copper Metallizations," Proceedings of the 4th AVS International Conference on Microelectronics and Interfaces, Mar. 3–6, 2003, p. 198 (3 pages).

J.Phillips et al., "Channeling effects during focused–ion–beam micromachining of copper," J.Vac.Sci.Technol.B 18(4), Jul./Aug. 2000, pp. 1061–1065.

J.Phillips et al., "H2O enhanced focused ion beam micromachining," J.Vac.Sci.Technol.B 13(6), Nov./Dec. 1995, pp. 2565–2569.

S.Pauthner, "Devicce modification and gas assisted etching on CU–samples," 3rd European FIB Users Group Metting (EFUG99) Programme and Abstracts, Oct. 4, 1999 (1 page).

H. Ximen et al., Halogen–Based Selective FIB Milling for IC Probe–Point Creation and Repair, Proceedings from 20th International Symposium for Testing and Failure Analysis, 1994, pp. 141–145.

H. Bender et al., Investigation on the Corrosion og Cu Metallization in the Focused Ion Beam System due to a low 12 Background, Proceedings from the 25th International Symposium for Testing and Failure Analysis, 1999, pp. 135–140.

L. Harriott, Digital scan model for focused ion beam induced gas etching, J.Vac. Sci. Technol. B 11(6), Nov./Dec. 1993, pp. 2012–2015.

R. Lee et al., Low Resisitivity FIB Depositions Within High Aspect Ratio Holes, Proceedings of the 22nd International Symposium for Testing and Failure Analysis, Nov. 8–22, 1996, Los Angeles, California, pp. 85–88.

V. Makarov et al., Copper Etch Milling Technique for Device Edits with the ISDS P3X and IDS P3Xa, Application Note # rev. 1.5, Jun. 19, 2001, pp. 1–5.

IDS P3X brochure, Schlumberger, printed Oct./1999, two pages.

PROCESS FOR CHARGED PARTICLE BEAM MICRO-MACHINING OF COPPER

RELATED APPLICATION

This application claims priority from U.S. Provisional Application Ser. No. 60/315,251, filed Aug. 27, 2001.

TECHNICAL FIELD

This invention relates to micro-machining copper using a charged particle beam in the presence of an etching assisting agent.

BACKGROUND

Aluminum, tungsten, and copper have been used for metal interconnections in integrated circuits. Copper is particularly desirable, especially in high performance integrated circuits, because of its low resistivity. In a typical operation, the copper is deposited into spaces micro-machined, using a global lithographic process, into the surface of a dielectric material such as silicon dioxide, to yield a series of metal interconnections in a predetermined pattern.

Charged particle beam micro-machining, assisted by a specific chemistry process, has been a useful process for local micro-machining metal interconnections during integrated circuit design and troubleshooting. Focused ion beam (FIB) micro-machining has been particularly useful in this regard, especially in debugging, editing, validation, metrology, and process control. In charged particle beam micro-machining, a metal trace is exposed to a beam of, e.g., gallium ions, often in the presence of a specific chemistry to assist removal of the metallization. Charged particle beam micro-machining has been used successfully to micro-machine aluminum and tungsten traces, resulting in fast and clean cutting.

Problems have arisen, however, in the case of copper. Certain chemistries, such as those based on iodine are generally inapplicable to copper metallizations. Iodine-based chemistries can spontaneously etch copper and corrode exposed copper within hundreds of microns from the initial beam exposure point. This corrosion can present serious reliability issues such as high resistivity, electrical leakage, and ultimately, conductor failure.

Copper traces consist of micro grains with various crystallographic orientations, causing the micro grains to etch at different rates. The presence of these micro grains leads to strongly pronounced channeling in the copper at some orientations. The net result is that the copper etches unevenly, thereby limiting the utility of charged particle beam processes in micro-machining copper interconnections. Furthermore, an underlying dielectric layer can experience some damage due to the uneven etching.

What is desired is a process that enhances the use of charged particle beam processes so that etching can be performed with minimal re-deposition and provide clean electrical isolation. It would also be desirable to provide a process that gives the capability of precisely milling copper, to ensure high isolation resistance so as to provide the electric isolation necessary for circuit modifications.

SUMMARY

The invention provides a process for micro-machining semiconductor materials that advantageously improves the etching and separation (e.g. cutting) of copper interconnections. Deeply buried traces can be cut in a substrate using the inventive process.

In one aspect of the invention, the process includes micro-machining a substrate in the presence of an etch assisting agent using a charged particle beam and thereby, forming a disconnection or separation in the copper. The process includes: (a) providing a substrate that includes a dielectric layer and copper overlying the dielectric layer; and (b) etching the copper with a charged particle beam in the presence of an etch assisting agent. The etch assisting agent can include ammonia, acetic acid, thiolacetic acid, or combinations thereof.

The invention provides a process for etching copper using a compatible chemistry, where the chemistry assists in achieving a relatively high selectivity of copper with respect to the underlying dielectric layer, resulting in cleaner, more even milling and cuts. By increasing the selectivity of copper, surface roughness development is decreased under ion bombardment. Reductions are also achieved in the re-deposition of the etched material and the electrical conductivity of any material that may be re-deposited.

DEFINITIONS

The following terms are intended to have the following meanings:

"Selectivity" is the ratio between the removal rates of copper (Cu) and the dielectric material (measured under the same conditions); and "Removal rate" and "etch rate" is the average thickness change per unit time, and is provided in e.g., microns/per sec.

DETAILED DESCRIPTION OF THE PREFERRED EMBODIMENTS

Figure 1C:
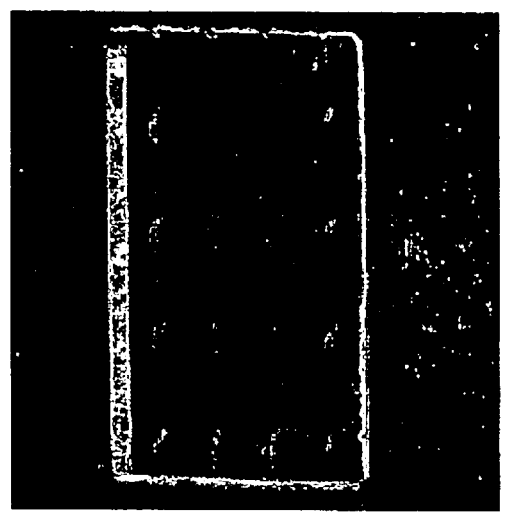
FIGS. 1A–1C are micrographs illustrating the results of a copper etch performed in the presence of water.

Uneven, inefficient etching of copper has been attributed to the etch rate's (e.g. removal rate) dependency on copper's crystallographic orientation. Grain dependent micro-machining has been shown to be due to channeling of the Ga+ in certain orientations; the more densely packed (111) crystal plane results in the energy deposition near the surface and thus increased sputtering over the more open planes. This is of particular concern during, for example, device modification operations (e.g. milling through power planes or bus lines to expose underlying metals) since the underlying dielectric layer may be damaged.

There are two general approaches to resolving the problem of uneven etching: (1) providing more even copper micro-machining (to suppress surface roughness formation) and (2) increasing copper etching selectivity with respect to the underlying dielectric (to prevent dielectric damage).

The process of the invention can micro-machine a substrate by etching a copper layer using a charged particle beam in the presence of an etch assisting agent. By etching or milling the copper in such an environment, etch selectivity relative to the underlying dielectric layer improves, resulting in cleaner, more even cuts of copper in the substrate. Furthermore, the etch assisting agent provides the capability of micro-machining fine signal traces as well as large, thick copper power and ground planes that overlay a dielectric layer.

A micro-machining process of the invention includes providing a substrate comprising a dielectric layer and copper overlying the dielectric layer; and etching the copper using a charged particle beam in the presence of an etch assisting agent, where the agent is a gas having ammonia, acetic acid, thiolacetic acid, or combinations thereof. The process can further include etching the dielectric layer to the charged particle beam in the presence of the etch assisting agent. Although copper is a preferred metal for a target substrate for etching, it is contemplated that various metals including, for example, silver (Ag), gold, (Au) and combinations thereof can be etched using a method of the invention.

In an aspect, the process can include a step of defining an etch area on the substrate and etching the copper within that etch area. After etching, the defined etch area can be substantially free of re-deposited uncomplexed copper. Etching the copper using the inventive process is useful for integrated circuit design modifications. In particular, the copper can be etched to form a good disconnection. The disconnection can then be modified using editing procedures, or re-wiring electrical circuitry.

The etch assisting agent can be any gaseous substance capable of providing high selectivity to increase the removal rate of copper over the dielectric layer. The etch assisting agent is preferably non-corrosive to a particle beam system (e.g. FIB column, vacuum chamber) yet is reactive with copper in the presence of such a beam. Preferably, the etch assisting agent is a compound that can be introduced into a vacuum as a vapor.

It has been found that an etch assisting agent comprising a gaseous compound such as, for example, ammonia, acetic acid, thiolacetic acid, or combinations thereof, can provide improved etch results when used in conjunction with a charged particle beam. Water can be added to the etch assisting agent. In a preferred process, a mixture of ammonia and water is used and such mixture can be produced from evaporated ammonium hydroxide.

Re-deposition is often associated with particle beam etching. Micro-machining using a process of the invention, however, can reduce re-deposition of the etched material (conductive copper and copper complexes) in the target etch area as well as its proximate area.

In addition to reducing the amount of re-deposition, a preferred process of the invention can also reduce the level of electrical conductivity of any material that may be re-deposited. This is accomplished by using preferred etch assisting agents that can convert a conductive material to a non-conductive material. For example, although not wishing to be bound by theory, it believed that, in the case of a gaseous mixture of ammonia and water, the copper reacts with the mixture to produce non-conductive complexes or compounds such as copper oxide (CuO), a generally known insulator. This is advantageous because particles of non-conductive copper complexes or compounds, if re-deposited into an etched area or its proximate area, would pose minimal concern. Thus, even if particles of these compounds become re-deposited in the etched out and proximate areas, the objective of etching out a non-conductive area (e.g. isolating the copper at specific points/areas) would still be met, as the re-deposited particles would be essentially non-conductive. In comparison, etching processes conducted without such an etch assisting agent may still allow unreacted copper to be re-deposited. This is undesirable, as unreacted copper would be conductive and the etched area would therefore not be considered a "clean" or highly isolated area. In a preferred aspect of the invention, the process of etching results in an etched area that is substantially free of conductive copper, conductive copper complexes and/or re-deposited uncomplexed copper. Also preferably, the area proximate to the etch area, such as any adjacent non-etched surfaces, is substantially free of conductive copper, conductive copper complexes, and/or re-deposited uncomplexed copper.

Use of the etch assisting agent in the process of the invention provides improved selectivity of copper over a dielectric layer. In particular, it has been found that higher copper selectivity over a dielectric comprising silicon dioxide could be achieved. High copper selectivity is desirable due to the great variation (up to 10 times) in removal rate with copper grain orientation.

Copper etching is dependent, among other things, on the crystallographic orientation of copper. It has been found that this dependency can be reduced by utilizing an etch assisting agent. Upon exposure of the copper layer to an etch assisting agent, the reaction (e.g. oxidation) of the copper achieves a more random surface structure. Although not wishing to be bound by theory, it is thought that the surface crystalline orientation of the copper becomes to some extent, amorphized and thereby randomized. The randomness in surface crystallographic orientation, in turn, increases the uniformity of etching (material removal) achieved by particle beam bombardment.

The average "natural" selectivity of copper over $SiO_2$ is approximately 2. The selectivity can be increased in various ways, including, for example, increasing the etching of copper, or decreasing the etching of $SiO_2$. It has been observed that a process of micro-machining using a charged particle beam in the presence of the etch assisting agent can advantageously increase the selectivity of the etching process to 2, where selectivity is characterized for a gaseous chemistry with respect to SiO2. In a preferred process, etching can occur where selectivity is 6, a significant increase compared to etching processes that do not use an etch assisting agent.

In certain processes, etching a copper layer may break through the copper layer to expose the dielectric layer. Thus, improved end point detection is a desirable property for a micro-machining process. The process of the invention can provide sufficient end-point detection to allow milling to a Cu-barrier/dielectric interface, with the precision desired to access underlying circuitry for editing, electronic beam probing, or other electrical testing. In the practice of the invention, the etch rate of the dielectric layer such as $SiO_2$ can be significantly reduced, by as much as about 9 to 10 times, as compared to etching without the etch assisting agent. Thus, micro-machining with the chemistry of the etch assisting agent through a copper layer can be accomplished quickly (due to the high selectivity of copper), yet upon contact with the underlying dielectric layer, the roughness formation can be substantially retarded or blocked (due to the reduced etch rate of the dielectric). This advantageously minimizes damage to the dielectric layer.

Micro-machining a substrate using the process of the invention can minimize surface roughness (i.e. increase the evenness) of an etched area. In particular, etched traces can be created having good floor uniformity (variation in floor height relative to the mean level). Traces are generally horizontal portions of an interconnection that can be made of several levels of metallization and generally reserved for thinner metallizations that carry power, ground, and/or signals. Planes or broader metallizations that carry power, ground and/or clock signals can also be modified and micro machined using a process of the invention.

A further advantage of the micro-machining process is the level of "cleanness" to the resulting cuts. As just discussed, re-deposition of etched material is often associated with conventional micro-machining processes. In a process of the invention, minimal re-deposition of copper or copper complexes occurs in the etched area as well as areas proximate to the etched area. For example, it has been found that a clean micro-machined trace cut can be achieved and can have a cut resistance greater than about 500 MΩ. This can be advantageous, particularly for editing operations. Evaluation of cuts made from a process of the invention, using for example, voltage contrast, has indicated that isolating copper trace cuts can be achieved. In comparison, voltage contrast reveals that without the use of the etch assisting agent invention, the cut can be non-isolating.

In the practice of the process, micro-machining in the presence of an etch assisting agent provides the capability of leaving no residue after etching, particularly residue that could spontaneously react upon exposure to air. Thus, the undesirable side effect known as "post-etch corrosion" can be minimized, if not eliminated.

A preferred substrate is a material having copper overlying a dielectric layer. The dielectric layer may be made up of a plurality of layers, each layer comprising a dielectric material. Suitable dielectric materials are any silicon-containing materials. Preferred dielectric layers comprise silicon-based compounds, that include, but are not limited, to silicon oxides (including silicon dioxide), silicon carbide, silicon nitride, or combinations thereof. Other suitable dielectric materials include, for example, materials with low dielectric constants (k) such as organic silicon oxides, fluorinated silicon oxides, and combinations thereof. Alternatively, these low-k dielectrics can be combined with silicon carbide, silicon nitride, and silicon oxide. Still further examples of dielectric materials include, for example, fluorinated silicate glass (FSG), carbon-doped siloxanes or organosilicate glass (OSG), hydrogen silsesquioxane (HSQ), other silicon glasses, and combinations thereof. FSG dielectrics have been found to be commercially useful for semiconductor fabrication. Therefore a preferred process also enables improved etch selectivity for copper over FSG.

"Copper" as used herein refers to any type of copper material, including copper alloys, especially those employed and being considered in semiconductor fabrication. The copper may be in or on any type of substrate, such as a semiconductor substrate or device. The copper layer typically overlies another material, a dielectric. The copper layer typically has a thin overlying or underlying layer between the copper layer and the underlying substrate or dielectric, such as a thin diffusion barrier, passivated layer, oxide layer or insulating layer. Examples of copper layers and substrates that may be the work piece in the present invention include, but are not limited to, that shown in U.S. Pat. Nos. 6,057,223; 5,959,358; 5,899,740; and 5,766,379, the disclosures of which are incorporated by reference herein in their entirety.

The inventive process provided herein can be used in a variety of ways including for example, shaping, design debugging, editing, probing and validation, and other electrical operations or tests. Etching is preferably conducted in a manner capable of preparing polycrystalline copper traces, particularly in deep sub-micron, FIB milled vias. In one aspect, the process of the invention can be performed during IC design, debug or device modification. In another aspect, micro-machining is performed according to a predetermined pattern, such as what is generally performed for microelectronics integrated circuit designs, MEMS (Micro-Electro-Mechanical Systems) devices and nanotechnology structures.

Examples of useful charged particle beams for the process include plasma beams and focused ion beams. Suitable plasma beam systems include broad ion beams as well as active or biased beams in which the substrate is exposed. Focused particle beam machining is known and disclosed, for example, in U.S. Pat. Nos. 5,616,921; 5,840,630; 5,798,529; and 6,140,655. A preferred process uses a focused ion beam, such as what is described in U.S. Pat. No. 5,140,164 which uses gallium ion beams.

Other processes that can be involved in the etching method of the invention include chemistry handling processes such as what is described in, for example, U.S. Pat. Nos. 5,700,526; 5,747,818; 5,840,630.

The invention will be described further by way of the following examples. These examples are not intended to limit the scope of the claims. Rather, the examples are provided for illustrative purposes only.

EXAMPLES

In each of the following examples, a focused ion beam (FIB) instrument was used—a Schlumberger Probe Systems Model IDS P2Xplus or IDS P3Xa system. The beam energy was 30 KeV.

For Examples 1–5, the samples contained a pattern of SiO2 pillars that penetrated to the surface of a 1.5 μm thick copper layer. Each pillar had a cross section of about 2 μm×2 μm, and was approximately 1.5 μm high Selectivity was estimated based on the ratio between the amount of copper etched compared to the amount of SiO2 etched off of the pillars.

Each sample had a Ta barrier layer on $SiO_2$. Cut resistance was measured on each sample, where a 1.3 μm wide copper line was etched so that the copper and its Ta (Tantalum) barrier layer were etched.

Levels of residual copper as well as the amount of re-deposition of copper after etching with the FIB instrument were estimated.

For Examples 6–7, the samples contained traces having about 1.1 μm×1.1 μm cross section. No pillars existed on the samples.

Comparative Example 1

The etch assisting agent used in this example, for comparative purposes, was water. The typical working pressure inside the chamber of the FIB instrument was $6\times10^{-5}$ Torr.

Figure 1B:
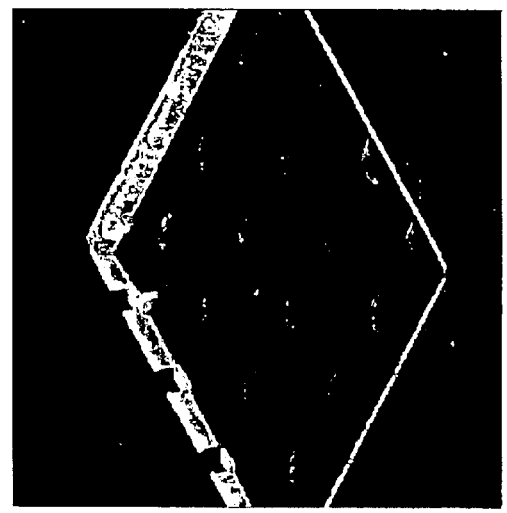
Figure 1A:
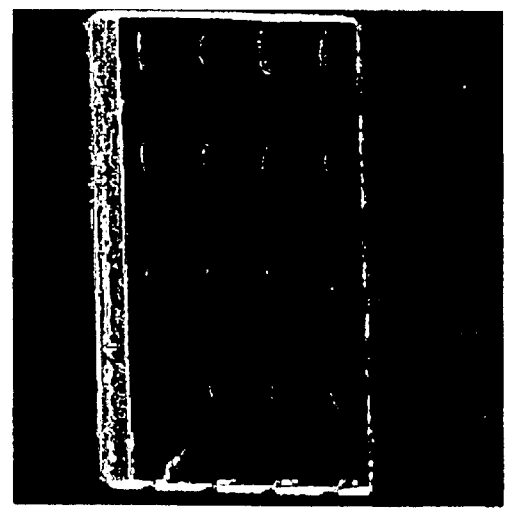
Figure 2A:
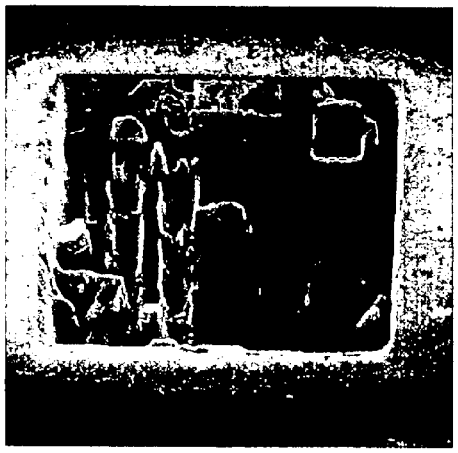
FIGS. 2A–2D are micrographs illustrating the results of a copper etch performed in the presence of ammonia.
Figure 2B:
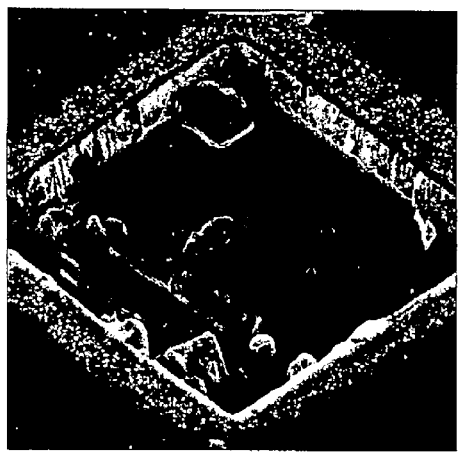
Figure 2C:
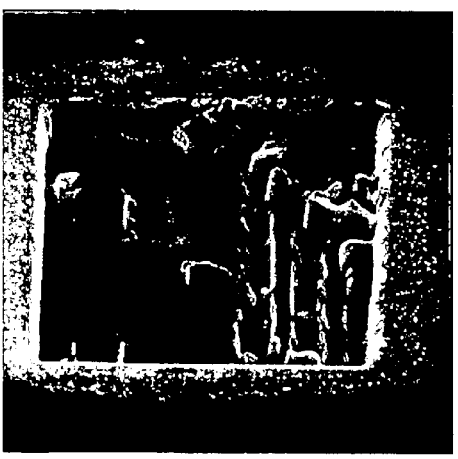
Figure 2D:

Microphotographs of substrates etched in this Example are provided in FIGS. 1A–1C. Minimal residual copper was observed in the etched area and the level of copper re-deposition was estimated as "low." It was estimated that etching in the presence of this chemistry achieved an average selectivity of 4. The amount of time required to achieve optimal selectivity was 120 min.

Example 2

The etch assisting agent used was ammonia gas. The flux of gas introduced into the etching chamber was controlled using a mass flow controller and a pressure regulator. The working pressure inside the chamber was about $9\times10^{-5}$ Torr.

FIGS. 2A–2D are FIB micrographs taken of samples from this Example. Minimal residual copper was observed in the etched area and the level of copper re-deposition was estimated as "high." The amount of time required to achieve optimal selectivity was 2 h 45 min It was estimated that etching in the presence of this chemistry achieved an average selectivity of 3. This selectivity was higher than that of a sample where no etch assisting agent was used.

Example 3

Figure 3C:
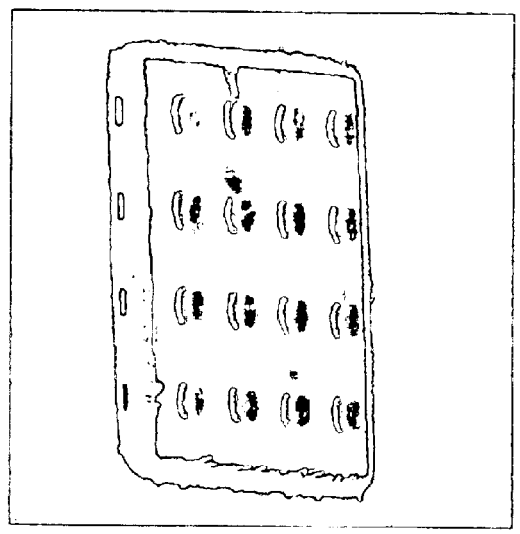
FIGS. 3A–3C are micrographs illustrating the results of a copper etch performed in the presence of ammonia and acetic acid.
Figure 3B:
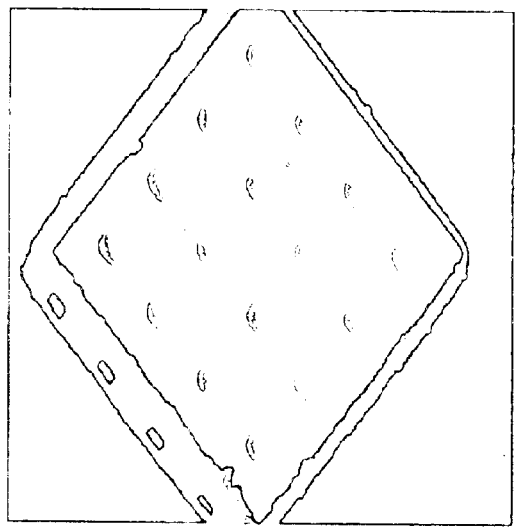
Figure 3A:
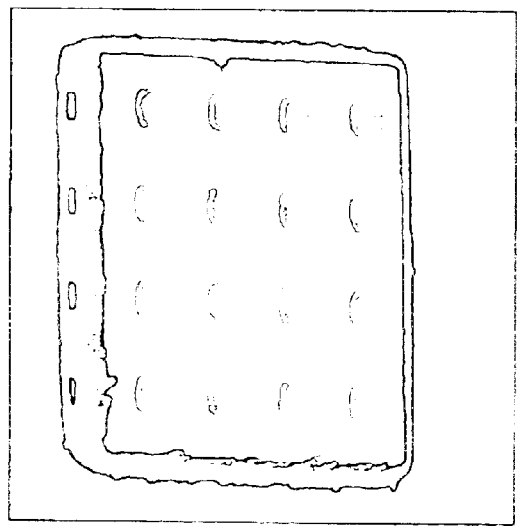
Figure 4A:
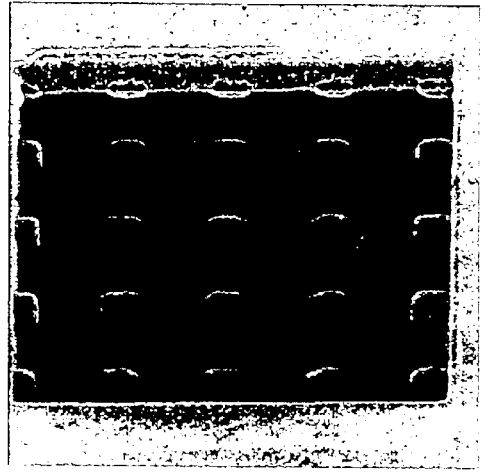
FIGS. 4A–4D are micrographs illustrating the results of a copper etch performed in the presence of thiolacetic acid.
Figure 4B:
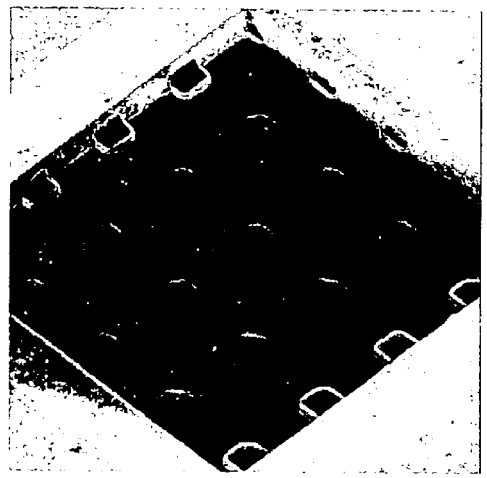
Figure 4C:
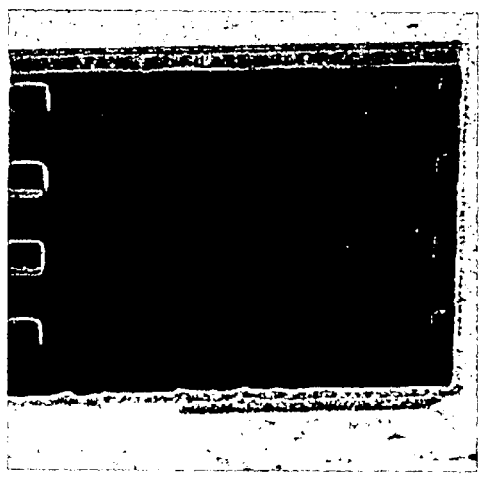
Figure 4D:
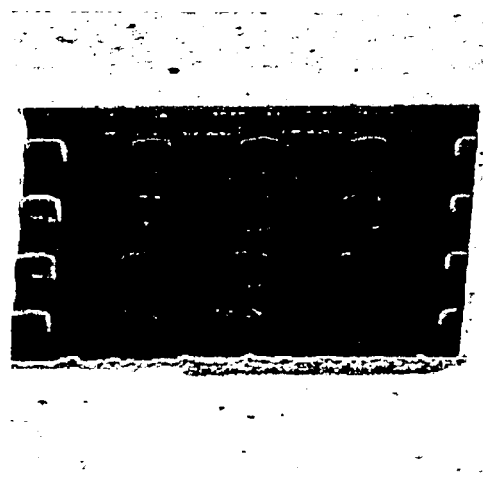

FIGS. 3A–3C are FIB micrographs taken of sample from this Example. Minimal residual copper was observed in the etched area and the level of copper redeposition was estimated as "low." The amount of time required to achieve optimal selectivity was 37 min. It was estimated that etching in the presence of this chemistry achieved an average selectivity of 4. This selectivity was higher than that of a sample where no etch assisting agent was used.

Example 4

The etch assisting agent used in this experiment was thiolacetic acid. The typical working pressure inside the chamber was $2.4\times10^{-5}$ Torr.

FIGS. 4A–4D are FIB micrographs taken of samples from this Example. Very clean copper etching was observed. The level of copper re-deposition was estimated as "medium." The amount of time required to achieve optimal selectivity was 50–60 min. It was estimated that etching in the presence of this chemistry achieved an average selectivity of 4. This selectivity was higher than that of a sample where no etch assisting agent was used.

Example 5

The etch assisting agent was a mixture of ammonium and water, where the precursor was ammonium hydroxide. The working pressure inside the chamber was about $1\times10^{-5}$ Torr.

Figure 5A:
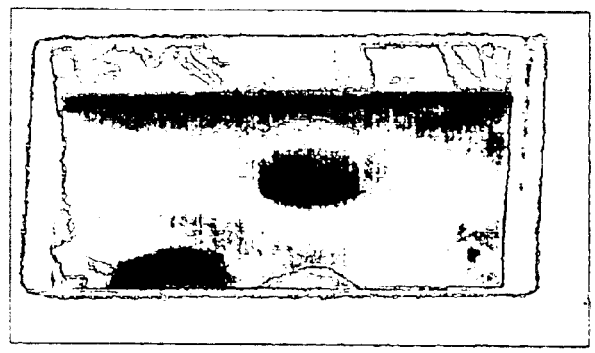
FIGS. 5A–5C are micrographs illustrating the results of a copper etch performed in the presence of ammonia and water, produced from ammonium hydroxide.
Figure 5B:
Figure 5C:
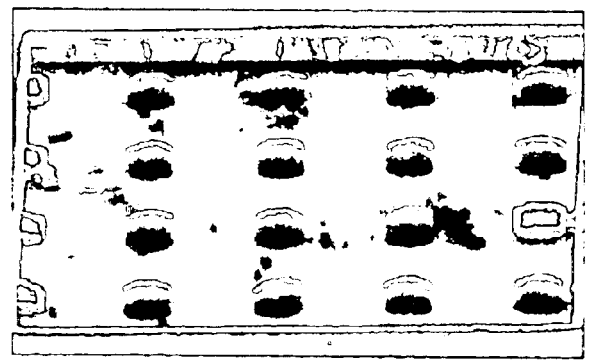

FIGS. 5A–5C are FIB micrographs taken of samples from this Example. Very minimal residual copper was observed in the etched area and the level of copper re-deposition was estimated as "extremely low." The amount of time required to achieve optimal selectivity was 40 min. It was estimated that etching in the presence of this chemistry achieved an average selectivity of 6. This selectivity was significantly higher than that of Comparative Example 1 as well as in a sample where no etch assisting agent was used.

Example 6 & 7

Cuts measuring $1.5 \mu m \times 1 \mu m$ were made in the comparative sample (Comparative Example 6) and the inventive sample (Example 7) using the following procedure:

A Gallium ion beam (Schlumberger IDS P3X FIB instrument) was used to etch the copper, where the current was 3 pA.

For Comparative Example 6 (no etch assisting agent), the cut was performed under a residual chamber pressure of $1\times10^{-6}$ torr (0.000001 torr) or below. Etching required approximately 6 minutes to complete the cut.

For Example 7, the cut made using a preferred process of the invention was performed under pressure of $NH_3$ and $H_2O$ in the chamber. The precursor for the ammonia/water mixture was 28% solution of $NH_3$ in $H_2O$. The chamber pressure was $3\times10^{-5}$ torr. The jet delivering the gas had 0.5 mm internal diameter and was positioned about 0.2 mm laterally and 0.3 mm in longitudinally from the center of the operation field at an angle of about 30 degrees from a direction perpendicular to the surface. Etching required approximately 7 minutes to complete the cut.

Figure 6:
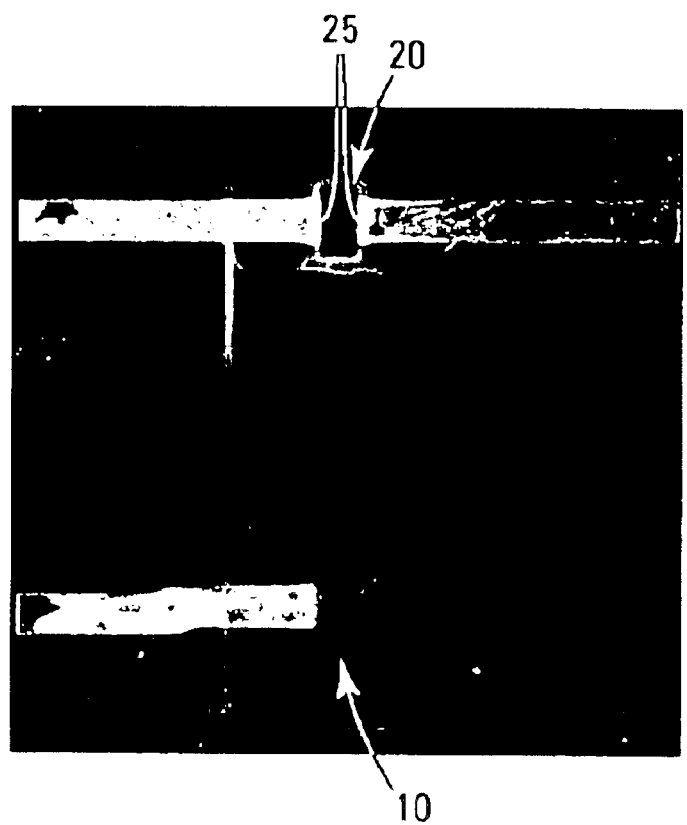
FIG. 6 is a micrograph illustrating the results of Examples 6 and 7.

Referring now to FIG. 6, using voltage contrast imaging, it was observed that the cut area marked as (10) made from etching in the presence of an etch assisting agent was very "clean" and isolating. In comparison, the comparative cut (20) had bright areas (pointed our by arrows 25) that indicate conductive copper as being redeposited onto areas proximate to the target cut area. From the voltage contrast, it was estimated that the cut resistance was more than $2\times10^{10}$ ohms, indicating high electrical isolation.

A number of embodiments of the invention have been described. Nevertheless it will be understood that various modifications may be made without departing from the spirit and scope of the invention. Accordingly, other embodiments are within the scope of the following claims.

What is claimed is:

1. A micro-machining process comprising:
    (a) providing a substrate comprising a dielectric layer and copper overlying said dielectric layer; and
    (b) etching said copper using a charged particle beam in the presence of an etch assisting agent comprising a gas selected from the group consisting of: a mixture of water and ammonia obtained from an ammonium hydroxide precursor; acetic acid; thiolacetic acid; and combinations thereof.

2. The process according to claim 1 wherein said etch assisting agent further comprises water.

3. The process according to claim 1 wherein said etch assisting agent further comprises acetic acid.

4. The process according to claim 1 wherein said dielectric layer comprises a compound selected from a group consisting of silicon oxide, organic silicon oxides, silicon dioxide, silicon carbide, silicon nitride, fluorinated silicon oxides, hydrogen silsesquioxane, and combinations thereof.

5. The process according to claim 1 wherein said charged particle beam comprises a focused ion beam.

6. A micro-machining process comprising:
    (a) providing a substrate comprising a dielectric layer and copper overlying said dielectric layer; and
    (b) etching said copper using a charged particle beam in the presence of an etch assisting agent comprising a gas consisting essentially at thiolacetic acid.

7. The process according to claim 6 wherein said etch assisting agent comprising a gas further consists essentially of ammonia, acetic acid, and combinations thereof.

8. The process according to claim 7 wherein said etch assisting agent comprising a gas further consists essentially of water.

9. The process according to claim 6 wherein said dielectric layer comprises a compound selected from a group consisting of silicon oxide, organic silicon oxides, silicon dioxide, silicon carbide, silicon nitride, fluorinated silicon oxides, hydrogen silsesquioxane, and combinations thereof.

10. The process according to claim 6 wherein said charged particle beam comprises a focused ion beam.

11. A micro-machining process comprising:
    (a) providing a substrate comprising a plurality of dielectric layers and copper overlying said plurality of dielectric layers; and
    (b) etching said copper using a charged particle beam in the presence of an etch assisting agent comprising a gas selected from the group consisting of ammonia, acetic acid, thiolacetic acid, and combinations thereof.

12. The process according to claim 11 wherein said etch assisting agent further comprises water.

13. The process according to claim 11 wherein said etch assisting agent further comprises acetic acid.

14. The process according to claim 11 wherein said dielectric layer comprises a compound selected from a group consisting of silicon oxide, organic silicon oxides, silicon dioxide, silicon carbide, silicon nitride, fluorinated silicon oxides, hydrogen silsesquioxane, and combinations thereof.

15. The process according to claim 11 wherein said charged particle beam comprises a focused ion beam.

16. A micro-machining process comprising:
   (a) providing a substrate comprising a dielectric layer and copper overlying said dielectric layer; and
   (b) etching said copper using a charged particle beam at a copper etch rate that is dependent on the crystallographic orientation of the copper in the presence of an etch assisting agent comprising a gas selected from the group consisting of ammonia, acetic acid, thiolacetic acid, and combinations thereof, wherein said dependency of the copper etch rate on crystallographic orientation of said copper is reduced.

17. The process according to claim 16 wherein said etch assisting agent further comprises water.

18. The process according to claim 16 wherein said etch assisting agent further comprises acetic acid.

19. The process according to claim 16 wherein said dielectric layer comprises a compound selected from a group consisting of silicon oxide, organic silicon oxides, silicon dioxide, silicon carbide, silicon nitride, fluorinated silicon oxides, hydrogen silsesquioxane, and combinations thereof.

20. The process according to claim 16 wherein said charged particle beam comprises a focused ion beam.

21. A micro-machining process comprising:
   (a) providing a substrate comprising a dielectric layer and copper overlying said dielectric layer; and
   (b) etching said copper using a broad ion beam in the presence of an etch assisting agent comprising a gas selected from the group consisting of ammonia, acetic acid, thiolacetic acid, and combinations thereof.

22. The process according to claim 21 wherein said etch assisting agent further comprises water.

23. The process according to claim 21 wherein said etch assisting agent further comprises acetic acid.

24. The process according to claim 21 wherein said dielectric layer comprises a compound selected from a group consisting of silicon oxide, organic silicon oxides, silicon dioxide, silicon carbide, silicon nitride, fluorinated silicon oxides, hydrogen silsesquioxane, and combinations thereof.

25. The process according to claim 21 wherein said charged particle beam comprises a focused ion beam.

26. A micro-machining process comprising:
   (a) providing a substrate comprising a dielectric layer and copper overlying said dielectric layer; and
   (b) etching said copper using a charged particle beam in the presence of an etch assisting agent comprising a mixture of water and ammonia obtained from an ammonium hydroxide precursor.

27. The process according to claim 26 wherein said etch assisting agent further comprises acetic acid, thiolacetic acid, and combinations thereof.

28. The process according to claim 27 wherein said etch assisting agent further comprises acetic acid.

29. The process according to claim 27 wherein said dielectric layer comprises a compound selected from a group consisting of silicon oxide, organic silicon oxides, silicon dioxide, silicon carbide, silicon nitride, fluorinated silicon oxides, hydrogen silsesquioxane, and combinations thereof.

30. The process according to claim 27 wherein said charged particle beam comprises a focused ion beam.

31. The process according to claim 26 wherein said etch assisting agent further comprises acetic acid.

32. The process according to claim 26 wherein said dielectric layer comprises a compound selected from a group consisting of silicon oxide, organic silicon oxide, silicon dioxide, silicon carbide, silicon nitride, fluorinated silicon oxides, hydrogen silsesquioxane, and combinations thereof.

33. The process according to claim 26 wherein said charged particle beam comprises a focused ion beam.

34. A micro-machining process comprising:
   (a) providing a substrate comprising a dielectric layer and copper overlying said dielectric layer; and
   (b) etching said copper using a charged particle beam in the presence of an etch assisting agent consisting of a mixture of water and ammonia obtained from an ammonium hydroxide precursor.

35. The process according to claim 34 wherein said dielectric layer comprises a compound selected from a group consisting of silicon oxide, organic silicon oxides, silicon dioxide, silicon carbide, silicon nitride, fluorinated silicon oxides, hydrogen silsesquioxane, and combinations thereof.

36. The process according to claim 34 wherein said charged particle beam comprises a focused ion beam.

37. A micro-machining process comprising:
   (a) providing a substrate comprising a dielectric layer and copper overlying said dielectric layer; and
   (b) etching said copper using a charged particle beam in the presence of an etch assisting agent consisting of thiolacetic acid.

38. The process according to claim 37 wherein said dielectric layer comprises a compound selected from a group consisting of silicon oxide, organic silicon oxides, silicon dioxide, silicon carbide, silicon nitride, fluorinated silicon oxides, hydrogen silsesquioxane, and combinations thereof.

39. The process according to claim 37 wherein said charged particle beam comprises a focused ion beam.

40. A micro-machining process comprising:
   (a) providing a substrate comprising a dielectric layer and copper overlying said dielectric layer; and
   (b) etching said copper using a charged particle beam in the presence of an etch assisting agent consisting of ammonia.

41. The process according to claim 40 wherein said dielectric layer comprises a compound selected from a group consisting of silicon oxide, organic silicon oxides, silicon dioxide, silicon carbide, silicon nitride, fluorinated silicon oxides, hydrogen silsesquioxane, and combinations thereof.

42. The process according to claim 40 wherein said charged particle beam comprises a focused ion beam.

43. A micro-machining process comprising:
   (a) providing a substrate comprising a dielectric layer and copper overlying said dielectric layer; and
   (b) etching said copper using a charged particle beam in the presence of an etch assisting agent consisting of a combination of ammonia gas and acetic acid.

44. The process according to claim 43 wherein said dielectric layer comprises a compound selected from a group consisting of silicon oxide, organic silicon oxides, silicon dioxide, silicon carbide, silicon nitride, fluorinated silicon oxides, hydrogen silsesquioxane, and combinations thereof.

45. The process according to claim 43 wherein said charged particle beam comprises a focused ion beam.

* * * * *